United States Patent [19]

Clark

[11] Patent Number: 5,109,287
[45] Date of Patent: Apr. 28, 1992

[54] INFORMATION STORAGE SYSTEM

[75] Inventor: Michael G. Clark, Gerrards Cross, England

[73] Assignee: The General Electric Company, p.l.c., England

[21] Appl. No.: 364,423

[22] PCT Filed: Oct. 5, 1988

[86] PCT No.: PCT/GB88/00820

§ 371 Date: May 31, 1988

§ 102(e) Date: May 31, 1988

[87] PCT Pub. No.: WO89/03629

PCT Pub. Date: Apr. 20, 1989

[30] Foreign Application Priority Data

Oct. 6, 1987 [GB] United Kingdom ............... 8723394
Feb. 19, 1988 [GB] United Kingdom ............... 8803922

[51] Int. Cl.$^5$ ............................................. H04N 1/00
[52] U.S. Cl. ................................. 358/403; 358/102; 358/479
[58] Field of Search ................. 358/403, 102, 479

[56] References Cited

U.S. PATENT DOCUMENTS

| | | | |
|---|---|---|---|
| 3,594,729 | 7/1971 | Uemura | 350/72.1 |
| 4,513,390 | 4/1985 | Walter et al. | 358/403 |
| 4,668,071 | 5/1987 | Mayer | 355/3 R |
| 4,682,318 | 7/1987 | Busby | 369/59 |
| 4,903,141 | 2/1990 | Morton et al. | 358/403 |

FOREIGN PATENT DOCUMENTS

| | | |
|---|---|---|
| 0231856 | 8/1987 | European Pat. Off. |
| 2006569 | 5/1979 | United Kingdom |
| 2089616 | 6/1982 | United Kingdom |
| 2102176 | 1/1983 | United Kingdom |

OTHER PUBLICATIONS

Imose et al., "Communication Control for Electronic Library", The New World of Information Society, Oct. 2/Nov. 2, 1984.

Primary Examiner—Edward L. Coles, Sr.
Attorney, Agent, or Firm—Kirschstein, Ottinger, Israel & Schiffmiller

[57] ABSTRACT

Data stored on a remotely-located storage sheet (29,30,31) which may, for example, be a sheet of a spare-parts manual used in the motor trade, can be updated by transmitting a signal from a central station (20) to a receiver (21,22,23) at the remote location. The storage sheet may be in the form of a microfiche. A liquid crystal storage device is used as the storage sheet, which device can be updated by light from a simple laser printer, an imaging array, or a CRT screen at the remote location, operated by the transmitted signal. This avoids the need to replace storage sheets when updating is necessary. The storage sheet may include two electrically conductive layers (2,6) between which are disposed a layer of a liquid crystal storage material (5) and a photoconductive layer (3). The liquid crystal material may be, for example, a liquid crystal polymer or a glassy nematic liquid crystal material.

17 Claims, 1 Drawing Sheet

INFORMATION STORAGE SYSTEM

BACKGROUND OF THE INVENTION

1. Field of the Invention

This invention relates to a system for updating, from a remote location, data stored on an optical data storage device.

2. Description of Related Art

In a number of industries, such as the automobile and aircraft industries, extensive technical manuals containing graphical and/or alphanumeric data are kept at a number of widely-spread locations. As an example, one can consider the spare parts departments of the many dealers supplying the vehicles of an automobile manufacturer. Each spare parts department will be provided with a batch of microfiches carrying exploded views of particular sections of each vehicle, together with the corresponding part numbers. It is essential that the microfiches be updated every time the manufacturer makes a significant change to the spare parts data.

At present, even if only a small proportion of the information stored on a microfiche is to be changed, a whole new microfiche must be sent to every dealer. A further problem then exists, in that the manufacturer has no way of checking that each dealer has received the updated information, and that the old microfiche has been destroyed.

SUMMARY OF THE INVENTION

It is an object of the present invention to provide a system in which optical data storage devices can be updated from a remote location.

According to the invention, an information storage system comprises transmitting means to be located at a first location; receiver means to be located at a second location; and an optical data storage device on which data can be updated at said second location by operation of a signal transmitted from the transmitter means to the receiver means.

The term "optical data storage device" herein is intended to relate to a sheet-like device which carries visual data in a substantially permanent form. It does not include electronic devices, such as visual display units, or other devices wherein data are stored electronically.

Preferably, the optical data storage device comprises a liquid crystal polymer (LCP) device which stores information by virtue of alignment of the molecules of the polymer material, and preferably the transmitted signal operates a laser at the receiver for writing data on the LCP device.

BRIEF DESCRIPTION OF THE DRAWINGS

Embodiments of the invention will now be described, by way of example, with reference to the accompanying drawing, in which.

DETAILED DESCRIPTION OF THE PREFERRED EMBODIMENTS

Figure 1:
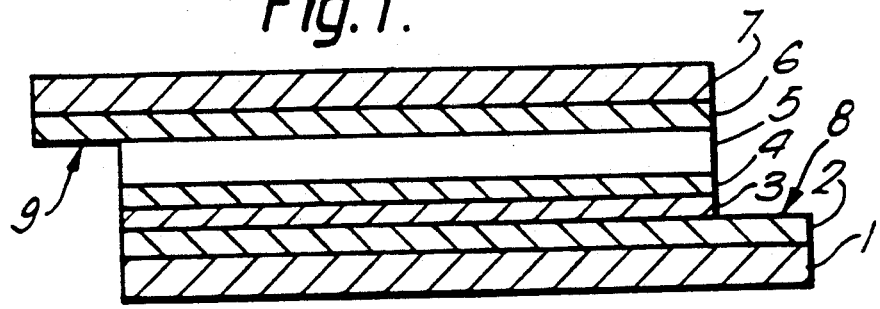
FIG. 1 is a schematic cross section of one form of updatable liquid crystal polymer optical data storage device suitable for use in a system in accordance with the invention.

One form of liquid crystal polymer device suitable for use, for example in microfiche format, in the present system is shown in FIG. 1. This device forms the subject of our copending British Patent Application No: 8723394. The structure of the device comprises a substrate 1 of a flexible optical quality plastics material which is suitable for film-based micrographic technology. The substrate may, for example, be a 100 $\mu$m thick layer of polyester, such as polyethylene terephthalate (PET), or the non-birefringent polyethersulphate (PES). An optically transparent electrode 2 formed of, for example, indium tin oxide (ITO), of say 200-300 Å thickness is sputtered directly on to the plastics substrate or on to a barrier layer (not shown) of, for example, silicon dioxide deposited on the substrate. A photoconductive (PC) layer 3 is deposited over the electrode 2. The PC layer may be of organic or inorganic material. A light-blocking layer 4 is shown in FIG. 1. This layer may be required in some applications, but may otherwise be omitted. If present in the structure, the layer 4 prevents the washing-out of the written image which can occur if a field is present during the readout process. The layer may be provided with a dielectric coating (not shown). A layer 5 of a recording medium is contained between the blocking layer 4, if present, or the photoconductive layer 3, if not, and a second electrode 6, similar to the electrode 2. The recording medium comprises a liquid crystal material as will be described later. The layer is, for example, 5-10 $\mu$m thick. The liquid crystal material may contain a pleochroic dye for efficient absorption of the energy from a laser which, in general, will be used for writing such microfiches. A layer 7, similar to the substrate layer 1, is formed over the conductive layer 6. The ends 8, 9 of the layers 1, 2, 6 and 7 project beyond the layers 3, 4 and 5 so that a voltage can readily be applied thereto.

It is known that certain liquid crystal materials exhibit laser-induced optical storage properties. For example, liquid crystal polymers as described in our copending British Patent Application No: 8714744 exhibit such properties. The polymers may be of nematic, cholesteric or smectic nature or plasticised liquid crystal polymers. Glassy nematic liquid crystal (GNLC) materials, low molar mass smectic A materials with or without nematic mesophases overlying the smectic phase, mixtures of low molar mass storage media such as smectic-cholesteric or cholesteric-nematic materials, microencapsulated smectic liquid crystals in polymeric binders, and smectic or smectic/cholesteric microdroplets dispersed in polymeric binders also exhibit storage properties. Furthermore, certain types of optically non-linear or other electroactive polymers such as liquid crystal copolymers wherein comonomers contain photoisomerisable groups, such as azobenzene moieties, are also suitable for forming optical data storage devices for use in the present invention.

Various processes using such storage media as listed above will now be described. One mode of operation for duplicating written information from a master fiche of any form involves projecting the master image on to a liquid crystal structure as shown in FIG. 1.

As a first example, a system which produces optical contrast by the difference between scattering regions and homeotropically aligned liquid crystal regions will be described. In this case, the initial state of the liquid crystal may be an entirely pseudo-homeotropic state produced by heating the material, which may be a smectic material, and then cooling it in the presence of an electric field produced by applying a voltage between the electrodes 2 and 6. The field is removed when the material is cool. Alternatively, the initial state of the microfiche liquid crystal may be of an entirely uniformly scattering nature such as obtained by heating the material to the isotropic state and cooling it without any applied field.

In use of a copy microfiche containing such a material, the master image is projected on to the photoconductive material of the microfiche and a field of a predetermined magnitude is applied across the liquid crystal material. The master image may be an image displayed on the cathode ray screen. The areas of the photoconductive layer 3 which receive light become conductive, whereas the unexposed areas, i.e. the areas masked by the written information on the master (assuming positive contrast on the master, by way of example) remain non-conductive. Hence, in those areas which are illuminated the applied field will appear almost entirely across the liquid crystal. If the microfiche is heated to take the liquid crystal material to the isotropic state, and the material is allowed to cool, the field in the illuminated areas will cause the liquid crystal molecules to align homeotropically. On the other hand, in the dark areas, where the field is shared between the liquid crystal and photoconductive layers, the field will be, by design, below the switching threshold for the particular liquid crystal material, so that no alignment takes place on cooling. A scattering image is therefore produced which is an exact replica of the master image, and of the same polarity.

Alternatively, the whole copy microfiche could be scanned in a raster-like manner by a laser which is focussed on the liquid crystal material to cause it to melt. This mode is expecially useful in the case where it is desired to produce a copy from the master with only the updated information on it, or where parts of copies are to be voided.

As the liquid crystal microfiche has an inherent selective erase facility, the user of the device can erase lines or individual characters at a later stage so as to edit the copy.

The storage devices described provide the facility for parallel addressing with direct size reduction from a document which is to be imaged. Hence, the microfiche can be made directly from a printed document instead of from a laser-generated image. The modulated light pattern obtained from the document is made to impinge on the liquid crystal layer/photoconductive layer structure as described above, after passing through a reducing optical system somewhat in the fashion of a photocopier.

Figure 2:
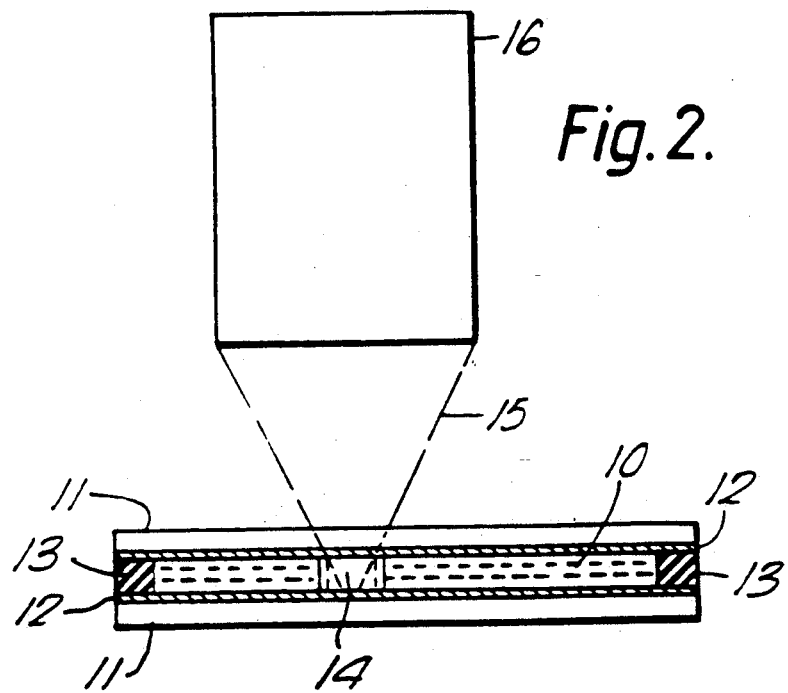
FIG. 2 is a schematic cross section of a second form of such updatable optical data storage device.

FIG. 2 shows an alternative form of optical storage device incorporating a liquid crystal polymer which is suitable for use in the present invention. This device is described in greater detail in our copending British Patent Application No: 8714744. The polymer is contained as a thin film 10 in a cell defined by two glass plates 11 on the inner surface of which are deposited transparent conducting films 12 of indium/tin oxide. Spacers 13 define the film thickness of about 10–30 microns, and this may also be assisted by putting glass fibres (not shown) of known width in the cell cavity. The conducting films 12 may uniformly cover the whole inner surface of the plates 11 or may be etched into a suitable pattern, e.g. dots or a seven-segment display. Regions 14 of the film may be thermally addressed by a focussed beam 15 from a laser 16. By means of appropriate optics and beam directing systems (not shown) the beam 15 may be moved around to focus on other regions of the film 10, so as to write information thereupon.

In use with a liquid crystal polymer, field induced alignment of a region 14 of the polymer occurs when an electric field of sufficient strenght is applied via the conducting films 12 if the region 14 of the polymer is heated by the beam 15.

The aligned texture in the region 14 is maintained when the applied field is removed. In the unaligned state the polymer 10 is opaque and provides minimal light transmission, whilst the field-aligned stored texture is optically isotropic and appears transparent. Alternatively, the polymer 10 may be aligned by heating in the presence of an aligning field and allowing it to cool, so storing a transparent texture over the whole of the polymer, and the regions 14 may have opaque unaligned texture durably written into them by heating in the absence of an aligning field.

Parts of the stored texture may be erased by selectively heating those parts to be erased and allowing them to cool in the presence of an aligning field. The whole of the stored texture may be erased either by heating the whole polymer 10 and cooling it in the presence of an aligning field, or by changing the parameters of the electric field, e.g. its frequency, direction or any combination thereof.

Figure 3:
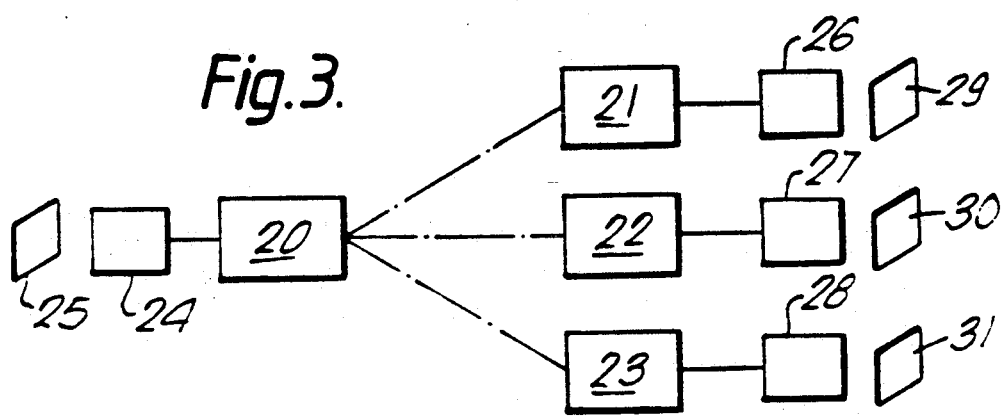
FIG. 3 is a schematic block diagram of an updating system in accordance with the invention.

Referring to FIG. 3 of the drawings, a transmitter 20 is located, for example, at the premises of an automobile manufacturer. Receivers 21, 22, 23 are located at the premises of respective dealers. The transmitter 20 can be connected, as required, to any or all of the receivers via, for example, private or public telephone lines or radio links. A data reader 24 for reading data from a document 25 is connected to the transmitter 2. To each receiver is connected a respective writer 26, 27, 28 for writing data into a storage device 29, 30, 31 such as described above with reference to FIG. 1 or FIG. 2.

In use of the system, when a document 25, such as a microfiche, has been updated by the manufacturer, the document is placed in position for reading by the reader 24. A connection is made to any of the receivers 21, 22, 23, as required, and the recipient is instructed to position his corresponding microfiche on his writer 26, 27, 28. It would be possible, by using suitable computer control of the transmitter 20, to establish connection to a large number of receivers, so that many microfiche copies could be updated simultaneously.

When the user at the receiving station has inserted the microfiche, the receiver reads off a unique code written on the microfiche and transmits it back to the transmitter for verification. The reader 24 then reads the updated microfiche 25 and the read-out data are transmitted, preferably in digitally coded form, to the receiver. The copy microfiche is thereby correspondingly updated. The updated copy microfiche may then be read by the receiving station and the read-out data transmitted back to the transmitter for verification that the updating is correct. The transmitting station can then record the fact that that particular copy has been updated. Alternatively, the successful updating could be verified by "direct read during write" techniques.

It would alternatively be possible for the system to provide automatic retrieval of data using contentaddressable memory techniques such as disclosed in our co-pending British Application No: 8712782 in which an algorithm identifies a best-fit within the data-base for particular data being sought. In that way, automatic retrieval of a microfiche requiring modification in the receiving and/or transmitting stations could be achieved.

The writers 26, 27, 28 for use with either of the types of optical data storage devices which are described above with reference to FIGS. 1 and 2 may be a relatively cheap laser writer, such as is well-known in laser disc and optical storage applications. The copy microfiches may be read by a conventional microfiche reader. Hard copies may be made from the microfiches, if required, by use of a reader/printer.

At the transmitting station, the new data to be transmitted may be read, for example by a CCD, from a paper document or from a fiche or other medium which displays data visually, and a corresponding digital signal generated for transmission. Alternatively, contact imaging from a document may be achieved by use of a large-area imaging array. Such array would again produce digital signals representing the imaged document.

The optical data storage devices described with reference to FIG. 1 could alternatively be updated by use of a cathode-ray tube screen at the receiving station, because the light generated by the screen would be adequate to cause changes in the conductivity of the photoconductive layer. It would then be possible to use a television camera to view the updated document at the transmitting station and to transmit a video signal via a cable or radio link to the receiving station for operation of the CRT device.

Although the embodiment described above relates to updating of spare parts manuals, it will be apparent that the system would be applicable to any type of data base requiring updating. For example, maps or timetables held at dispersed locations could be readily updated by the system. It would be particularly useful where a large fraction of the data is graphical rather than alphanumeric.

Although the optical data storage devices described above are based on liquid crystal polymers, other optical data storage devices which exhibit suitable changes of state in response to applied signals could be used.

Clearly, the devices need not be of the microfiche format described above.

I claim:

1. An information storage system, comprising: transmitter means located at a first location, and operative for transmitting a transmitted signal; receiver means located at a second location remote from said first location, and operative for receiving the transmitted signal; and a micrographic optical storage device located at said second location, and operative for storing analogue optical data, said stored optical data being updatable on said micrographic optical device at said second location by being erased and replaced with updated optical data in response to the transmitted signal being received by the receiver means.

2. A system as claimed in claim 1, wherein the transmitted signal is a digital signal from a data reader.

3. A system as claimed in claim 1, wherein the receiver means includes a laser for writing the updated data on the optical data storage device.

4. A system as claimed in claim 1, wherein the receiver means includes a cathode ray tube for writing the updated data on the optical data storage device.

5. A system as claimed in claim 1, wherein the transmitted signal is transmitted over a telephone line.

6. A system as claimed in claim 1, wherein the transmitted signal is transmitted over a radio link.

7. A system as claimed in claim 1, wherein the receiver means includes means to transmit to said first location a code identifying an optical data storage device whose optical data is to be updated.

8. A system as claimed in claim 1, wherein the receiver means includes means for reading data from the updated data to obtain read data and for transmitting said read data to said first location for verification.

9. A system as claimed in claim 1, wherein the transmitter means includes an imaging array for producing the transmitted signal.

10. A system as claimed in claim 1, wherein the transmitter means includes a television camera for viewing a data source and thereby deriving the transmitted signal for transmission.

11. A system as claimed in claim 1, wherein the optical data storage device has a microfiche configuration.

12. A system as claimed in claim 1, wherein the optical data storage device forms part of an updated technical manual.

13. A system as claimed in claim 2, wherein the receiver means includes a laser for writing the updated data on the optical data storage device.

14. A system as claimed in claim 1, wherein the optical data storage device includes a liquid crystal material as a storage medium.

15. A system as claimed in claim 14, wherein the liquid crystal material comprises a liquid crystal polymer.

16. A system as claimed in claim 14, wherein the liquid crystal material comprises a glassy nematic liquid crystal material.

17. A system as claimed in claim 14, wherein the liquid crystal material comprises a low molar mass storage material.

* * * * *